United States Patent [19]
Whitesell

[11] Patent Number: 6,083,566
[45] Date of Patent: Jul. 4, 2000

[54] SUBSTRATE HANDLING AND PROCESSING SYSTEM AND METHOD

[76] Inventor: Andrew B. Whitesell, 12929 Pierce Rd., Saratoga, Calif. 95070

[21] Appl. No.: 09/084,840

[22] Filed: May 26, 1998

[51] Int. Cl.$^7$ .............................. B05D 3/00; C23C 14/34
[52] U.S. Cl. .............. 427/445; 204/192.12; 204/298.24; 204/298.25; 204/298.26; 204/298.27; 118/695; 118/719; 156/345; 414/217; 414/938; 414/940; 414/941
[58] Field of Search ......................... 204/192.12, 298.24, 204/298.25, 298.26, 298.27; 118/695, 719; 156/345 PC, 345 WH, 345 MC; 427/445; 414/217, 938, 940, 941

[56] References Cited

U.S. PATENT DOCUMENTS

| | | | |
|---|---|---|---|
| 4,500,407 | 2/1985 | Boys et al. | 204/192.1 |
| 4,685,193 | 8/1987 | Faria et al. | 29/558 |
| 4,718,637 | 1/1988 | Contin | 251/158 |
| 4,735,540 | 4/1988 | Allen et al. | 414/222 |
| 4,749,465 | 6/1988 | Flint et al. | 204/298.25 |
| 4,951,601 | 8/1990 | Maydan et al. | 118/719 |
| 4,988,130 | 1/1991 | Obara et al. | 285/328 |
| 5,181,556 | 1/1993 | Hughes | 165/80.1 |
| 5,215,420 | 6/1993 | Hughes et al. | 414/217 |
| 5,287,914 | 2/1994 | Hughes | 165/80.1 |
| 5,376,212 | 12/1994 | Saiki | 156/345 |
| 5,388,944 | 2/1995 | Takanabe et al. | 414/217 |
| 5,391,231 | 2/1995 | Schertler | 118/503 |
| 5,415,694 | 5/1995 | Kunz et al. | 118/730 |
| 5,425,611 | 6/1995 | Hughes et al. | 414/217 |
| 5,470,451 | 11/1995 | Kobayashi et al. | 204/298.03 |
| 5,482,612 | 1/1996 | Armstrong et al. | 204/298.11 |
| 5,534,072 | 7/1996 | Mizuno et al. | 118/728 |
| 5,618,388 | 4/1997 | Seeser et al. | 204/192.12 |
| 5,766,360 | 6/1998 | Sato et al. | 118/666 |
| 5,882,413 | 3/1999 | Beaulieu et al. | 118/719 |

OTHER PUBLICATIONS

Intevac, Inc., Thin–Film Technology: Tradition and Innovation, 1996.
Intevac, Inc., 1995 Annual Report, 1996.
Leybold AG, New Circulus, 1995.

*Primary Examiner*—Nam Nguyen
*Assistant Examiner*—Steven H. Ver Steeg
*Attorney, Agent, or Firm*—Martin S. Chizek

[57] ABSTRACT

The present invention relates in a system and method for handling and processing substrates for magnetic and optical media and other types of substrates, such as wafers and lenses, requiring thin-film coatings. The system includes input and output locks which act as buffers between atmosphere and the high vacuum within the system and a transfer/main chamber which is comprised of a variable number of chamber modules. The system also includes various mechanisms for moving the substrates and the substrate carriers within the system, and components for dealing with the process and environmental requirements.

70 Claims, 10 Drawing Sheets

SUBSTRATE HANDLING AND PROCESSING SYSTEM AND METHOD

BACKGROUND OF THE INVENTION

1. Technical Field

This invention relates generally to processing substrates and more specifically, to an automated system for handling thin substrates requiring thin-film coatings, such as magnetic and optical disks, wafers, lenses, and glass panels and the processing of the substrates within a series of process chambers.

2. Discussion of Prior Art

Sputtered thin films are widely employed in the manufacture of magnetic and optical disks, wafers, lenses and glass panels. Magnetic and optical disks are used in mass storage devices for digital information. The competitive nature of the digital storage market continues to force media manufacturers to produce disks with greater storage capacities and at lower costs. The equipment used to produce the disks must meet these demands by providing increased throughput, higher quality product, improved yield, greater uptime, reduced maintenance, more flexibility, and lower purchase and operating costs.

There are a number of prior art systems which handle and process substrates for magnetic and optical media. Such deposition systems fall into two general categories: in-line sputtering systems and static sputtering systems.

In-line systems typically carry a large number of substrates arranged on a pallet. The pallet is loaded in the atmosphere then introduced into the system. Typically, the pallet moves continuously through the system during the processing of the substrates. Processing often occurs in a common vacuum chamber while the pallets are in motion. While this methodology has a distinct throughput advantage it has a number of disadvantages. Because processing occurs while the substrates are in motion relative to the process stations, the quality and uniformity of the applied coatings are sacrificed. Since processing often occurs in a common chamber, a process in one station can contaminate a process in another. The pallets are commonly partially coated incidentally along with the substrates. Because the pallets are repeatedly coated, the coating begins to flake, creating particulates that are detrimental to the substrates and equipment. Exposure of the pallet to atmosphere after each production run exacerbates the flaking problem. Therefore, the pallet and transport systems require frequent, extensive and costly servicing and cleaning.

Static sputtering systems typically load one substrate into a process station at a time and sequentially process each substrate in isolation from other substrates being processed, with no relative motion between substrate and the deposition source during the processing. The components that handle the substrates during processing are not exposed to the atmosphere. Instead, the substrates are loaded into the vacuum chamber through a load lock chamber and then transferred onto the substrate handling components. The disadvantages of inline systems are thus largely reduced or eliminated. Although inline systems have superior throughput, static systems are more capable of producing the high quality media demanded by the market.

U.S. Pat. No. 5,215,240 to Berg et al. discloses a static sputtering system that supports substrates in a vertical orientation and moves the substrates through the system in a sequential, circular pattern. The substrates are transported into the system by a conveyor system using sets of gear-driven rollers. Individual substrates are removed from a cassette by a lift blade, then transferred from the lift blade to the main chamber transport. Once deposited onto a pedestal on the main chamber transport the substrate is moved sequentially through a series of process chambers congruous with the main chamber. The main chamber transport moves downward, rotates the pedestal to be under a process station, then moves upward until the substrate is in a process chamber where the first of a series of processes can occur. Each substrate is processed in isolation from the other substrates. This down, rotate, up, process sequence continues until the substrate has been fully processed and removed from the main chamber transport and while other substrates are continually loaded, processed, and unloaded. After being removed from the main chamber transport the substrate is placed in a cassette which, when full, is removed from the system through an unload lock chamber.

The large number of moving parts within the vacuum chamber are detrimental to the quality of the vacuum and tend to generate particulate matter, require careful alignment, need continuous maintenance, and are not easily accessible. The high vacuum pumps are located several feet from the process chambers they pump, limiting conductance. Dimensional changes to the system, due to thermal expansion and pressure differentials, reduce transport reliability and necessitate the use of complicated compensation methods. The three-motion index of the main chamber transport system limits the throughput of the system and reduces transport reliability. Additional limitations, some shared by other commercially available static sputtering systems, include:

(a) large chambers that are inflexible and expensive to manufacture, and therefore are not readily adaptable to customer needs;

(b) high-vacuum pumps that are used on one side of the process chamber and result in asymmetrical pumping, pressure differentials within the chamber, and non-uniform process parameters;

(c) complex cassette handling systems that are difficult to align, suffer reliability problems, and generate particulate matter;

(d) complex substrate handling systems that require precise alignment and extensive maintenance, and are prone to substrate mishandling and excessive downtime;

(e) handling systems that contact the substrate several times and correspondingly increase the probability of damaging the substrates;

(f) complex handling systems that are costly, reduce vacuum quality and make troubleshooting difficult; and (g) handling systems that require several modifications in order to accept differently-sized cassettes and substrates.

SUMMARY OF THE INVENTION

It is an objective of the present invention to provide an improved substrate handling and processing system.

It is a further objective to provide a system capable of loading cassettes of substrates into a vacuum chamber without disrupting the vacuum quality within the chamber.

It is a further objective to provide a substrate handling system that generates a minimal amount of particulate matter and that is not detrimental to the vacuum quality within the system.

It is a further objective to provide a system for serially processing substrates individually on a continuous basis, with a plurality of process stations operating simultaneously on individual substrates.

It is a further objective to provide a method of processing individual substrates in isolation from other processes.

It is a further objective to provide a system capable of automatically positioning substrates to be ready for processing.

It is a further objective to provide a system offering high reliability, maintainability, flexibility, and operability.

It is a further objective to provide a system capable of producing superior thin films with fewer imperfections. Furthermore, it is an objective of the invention to address known shortcomings of prior art systems and to provide:

(a) a potential throughput superior to prior art static sputtering systems, (b) a system capable of achieving superior vacuum, (c) symmetrical high vacuum pumping within close proximity of the process stations, avoiding convoluted, conductance limiting pathways, (d) a simple handling system that minimizes the number of moving parts, particulate generation, calibration, maintenance and downtime, and is less sensitive to dimensional changes to the system during operation, (e) a system capable of handling a variety of cassette sizes without requiring adaptation of the handling system, (f) a system capable of handling a variety of substrate sizes with minimal adaptation of the system, (g) a handling system that reliably suspends each substrate, (h) a transport system which handles the substrates as little as possible, and (i) a system that is less costly to manufacture.

The present invention achieves these objectives by providing a system comprising means for automatically loading and unloading cassettes containing vertically oriented substrates, means for transporting the cassettes within a chamber of the system, means for transferring the substrates within the cassettes to and from a substrate carrier, means for aligning a substrate for suspension within the substrate carrier, means for suspending the substrate within the substrate carrier, and means for transporting the substrate carrier within the system to a series of process stations at which the substrate can be processed. The invention also comprises means for sealing a process station employing two station isolators, each incorporating an expansion joint and a sealing surface, positioned on either side of the substrate carrier such that when activated the expansion joint forces the sealing surface against mating surfaces on the substrate carrier, which, in conjunction with process barrels mounted to each station isolator, forms a process chamber. Further, the station isolator functions as a delivery system for a plurality of process gases.

A system and method for more economically producing higher quality processed substrates at a higher processing rate is disclosed, as shown in a preferred embodiment with reference to the accompanying drawings.

DETAILED DESCRIPTION OF THE PREFERRED EMBODIMENT

The substrate handling and processing system of the present invention has several chambers including a load lock chamber, a transfer chamber, a main chamber and an unload lock chamber, all designed to meet ultra-high vacuum requirements. Metal seals, rather than elastomeric O-ring seals, are used between nearly all joined parts that separate vacuum spaces from the environment outside the system. The system's capability for holding an ultra high vacuum (UHV) prevents detrimental gases from contaminating substrates within the system and enables the system to produce exceptionally high quality media.

Substrates are loaded into the system by way of a load lock chamber 101 that is selectively isolated from the outside environment as well as from the environment inside the transfer chamber. Opening the load lock chamber to the atmosphere involves slowly introducing an inert gas such as nitrogen into the load lock chamber until the chamber pressure reaches atmospheric pressure, then opening the gate-valve separating the atmosphere and the load lock chamber. Multiple substrates are brought into the system in cassettes rather than individually to improve throughput and to reduce particle contamination.

After a cassette of substrates has been loaded into the load lock chamber, the load lock chamber is sealed and pumped by a conventional pump to rough vacuum. Pumping action is again slow to avoid stirring up particles within the chamber that could contaminate the substrates. A high vacuum pump in selective isolation is coupled by a valve to the load lock chamber, and the valve is opened to bring the chamber to high vacuum and the rough pump valve is closed. A gate valve is then opened to allow the load lock chamber and the transfer chamber to communicate with each other. The unload lock chamber 103 functions in a similar manner.

Within the transfer chamber 102, unprocessed substrates are unloaded from a supply cassette and loaded into a substrate carrier, and processed substrates are unloaded from a substrate carrier and loaded into a receiving cassette. The transfer chamber is in direct communication with the main chamber.

The main chamber 104 consists of a plurality of modules. Each module includes one or more flange pairs, with the flanges in each pair being in parallel planes on opposing sides of the system. Each pair of flanges designates a process station. The flanges are capable of accepting various attachments including blank plates, instrumentation, pumps, process equipment, and station isolators. The internal volume of the main chamber is minimized to reduce the time to pump the system down to vacuum and to reduce the amount of water vapor that can condense on the internal surfaces of the system. Because the main chamber is made up of modules that are easily added or removed, the machine is readily configurable to have four or more process stations. In contrast to prior art systems that have a fixed number of stations, the present invention can be optimized for a customer's process or available space.

Most of the mechanisms used to transport the cassettes and substrates within the system are commercially available items designed for use in a high vacuum while minimizing out-gassing and particulate generation. The transport mechanisms are also less sensitive than prior art systems to misalignment and dimensional changes caused by thermal expansion and deflection of the chamber, which reduces problems of calibration, maintenance and substrate mishandling.

The vacuum robots are conventional vacuum-compatible z/θ/r axis robots that move the cassettes into, and out of, the locks and that position the cassettes within the transfer chamber. Using robots eliminates the need in the prior art to use complex conveyor systems requiring multiple motors, vacuum rotary feed-throughs, gears, and sensors. The approach of the present invention simplifies the transport system, is cleaner, and allows greater flexibility in the system design.

The cassette elevators are conventional vacuum compatible components that are attached to the transfer chamber and used to lift and orient the cassette such that the cassette centerline shares the axis of motion of the substrate transit.

The substrate transit is a conventional vacuum compatible component attached to the transfer chamber. It consists primarily of a shaft that has a single axis of motion ranging from a retracted position to a position within a substrate carrier, and an end-effector that engages and supports a substrate as it is transferred from a cassette to a substrate carrier and vice-versa.

The invention employs a novel substrate carrier with means for aligning a substrate for pick up and suspension, and a carriage for supporting the substrate carrier and moving it about a main chamber. Because indexing the substrate carriers from station to station does not require multiple motions, transport is rapid and more reliable.

The transport system is designed to handle the substrates as little as possible and thereby avoid damaging the substrates. There are only four substrate transfers; when the substrate is removed from the cassette, when the substrate is placed into the substrate carrier, when the substrate is removed from the substrate carrier, and when the substrate is returned to the cassette. Prior art systems may contact substrates six or more times. Furthermore, the substrate is only contacted on the outer diameter within the substrate carrier, while prior art systems contact the outer diameter as many as five times.

Furthermore, converting the transport system to accept different substrate sizes only requires replacing the end-effector of the substrate transit and the pick-up rings in the substrate carriers. No extensive alignment is necessary. Converting a prior art system can require several hours of downtime as there are more components that need to be replaced, accessing those components is difficult, and the components must be carefully aligned.

The invention also provides a novel means for sealing a process chamber so that gases used by a process in a chamber do not contaminate processes occurring in other process chambers. A station isolator on each side of a process station forces a sealing surface against a substrate carrier, thereby creating a sealed volume. When activated, the station isolator also permits a process chamber to be vented to the outside atmosphere without affecting the vacuum environment within the main chamber or within the other process stations, which permits easy replacement of sputtering targets and shields. Furthermore, the station isolator serves to provide the process gases required by the process within a particular station and to deliver the gases in a uniform manner about the substrate being processed. The gas delivery has the additional function of preventing process products from contaminating the seal of the station isolator.

The invention has a novel process barrel that contains a process apparatus such as a sputter source. A typical sputter station, for example, has a process barrel mounted to a station isolator on each side of the station, and a high vacuum pump mounted directly on each process barrel. Attaching the pump directly to the process barrel eliminates long, convoluted, conductance-limiting pathways as seen in prior art systems. Because there is a pump on each side of the process station, pumping is symmetrical, pressure differentials within the chamber are minimized, and side-to-side process parameter differences are minimized.

The present invention has greater pumping capacity in comparison to prior art systems: there are two pumps on every process station, the main chamber and transfer chamber have additional pumps, and the pumps are all connected directly to their respective chambers. There are also water traps in the locks, the transfer chamber and the main chamber for quick removal of water vapor.

Several factors make the present invention superior from a manufacturing point of view. The system is designed to use as many commercially available parts as possible, the remaining custom parts are simple and require less machining to manufacture, and the chambers are modular so there are no large, expensive parts. The system is also very 'open' to easily accommodate process equipment not designed specifically for the system, including equipment that would be too large to use with prior art systems. This permits unprecedented flexibility in system attachments. The use of standard flanges simplifies the task of designing new components and makes it easy for customers to develop and attach their own process equipment.

Figure 1:
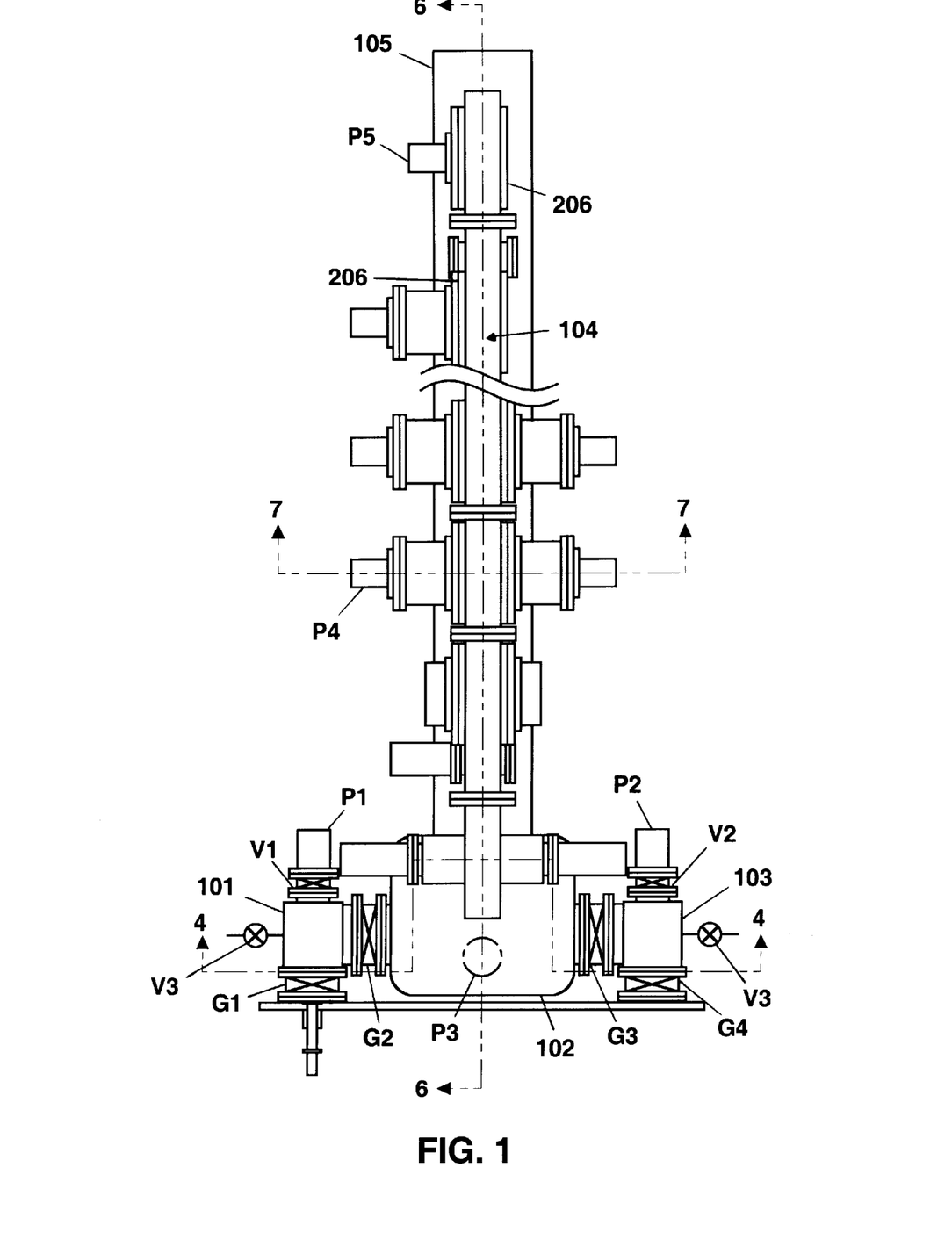
FIG. 1 is a top view of a preferred embodiment of the apparatus.
Figure 2:
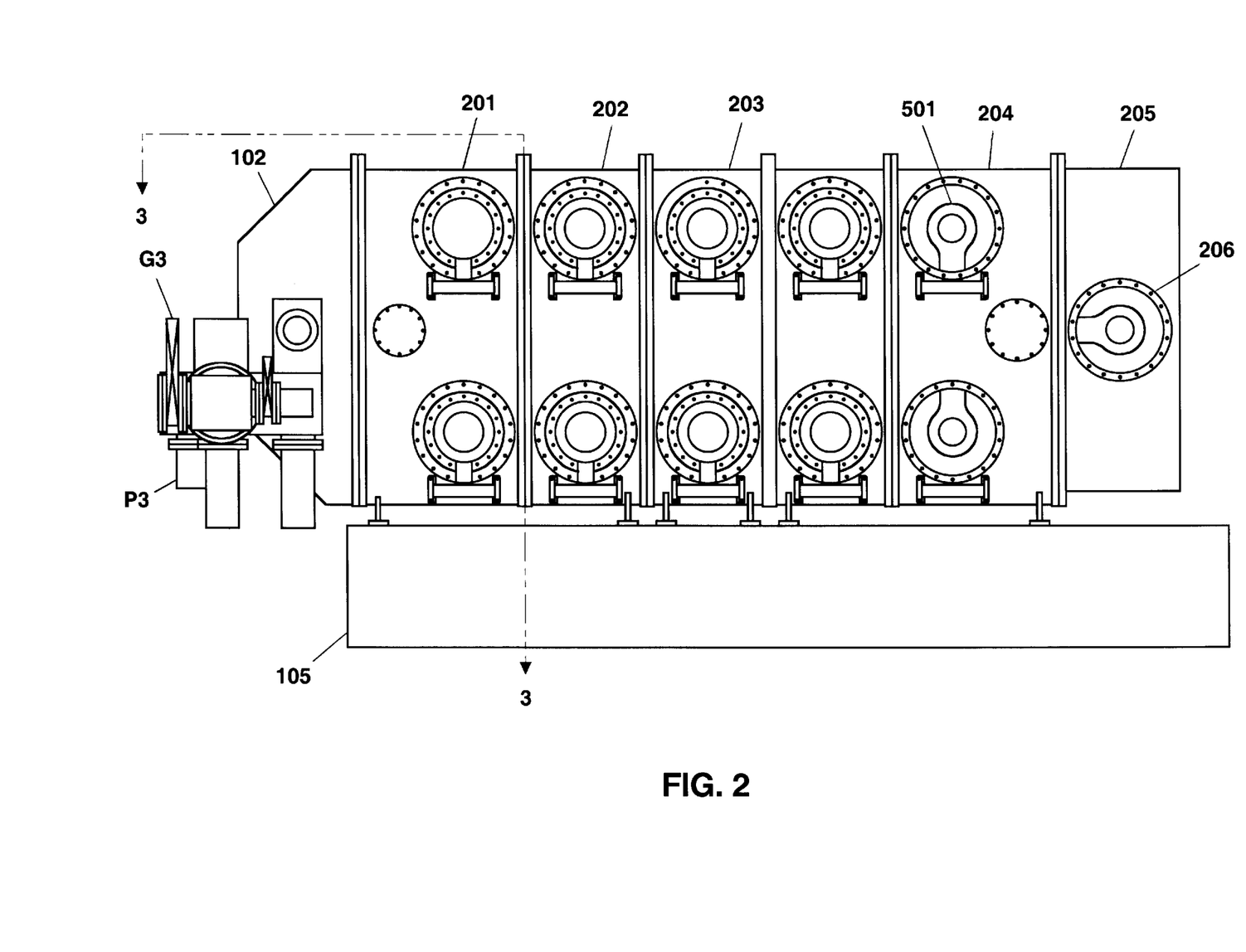
FIG. 2 is a side view in the direction of arrows 2—2 of the embodiment of FIG. 1.

FIGS. 1 and 2 present a general overview of the system. A load lock chamber 101 is in selective communication via a gate-valve G1 to the environment outside the system, and via a gate-valve G2 to the transfer chamber 102 and beyond to the main chamber 104. Valve V1 selectively isolates conventional high vacuum pump P1 from the load lock chamber 101. Load lock chamber 101 also has a variety of ports (not shown) for attachment of conventional pumps, sensors and instrumentation. The load lock chamber 101 acts as an environmental interface through which a substrate can be loaded into the transfer chamber 102 with minimal effect on the vacuum within the transfer chamber 102. The depicted embodiment of load lock chamber 101 is capable of containing a single cassette 210 (FIGS. 3A, 3B, 4 and 6) containing a plurality of substrates. An alternate embodiment (not shown) can accommodate two cassettes 210 with the objective of allowing slower pumping, less particle generation and increased throughput.

Figure 3A:
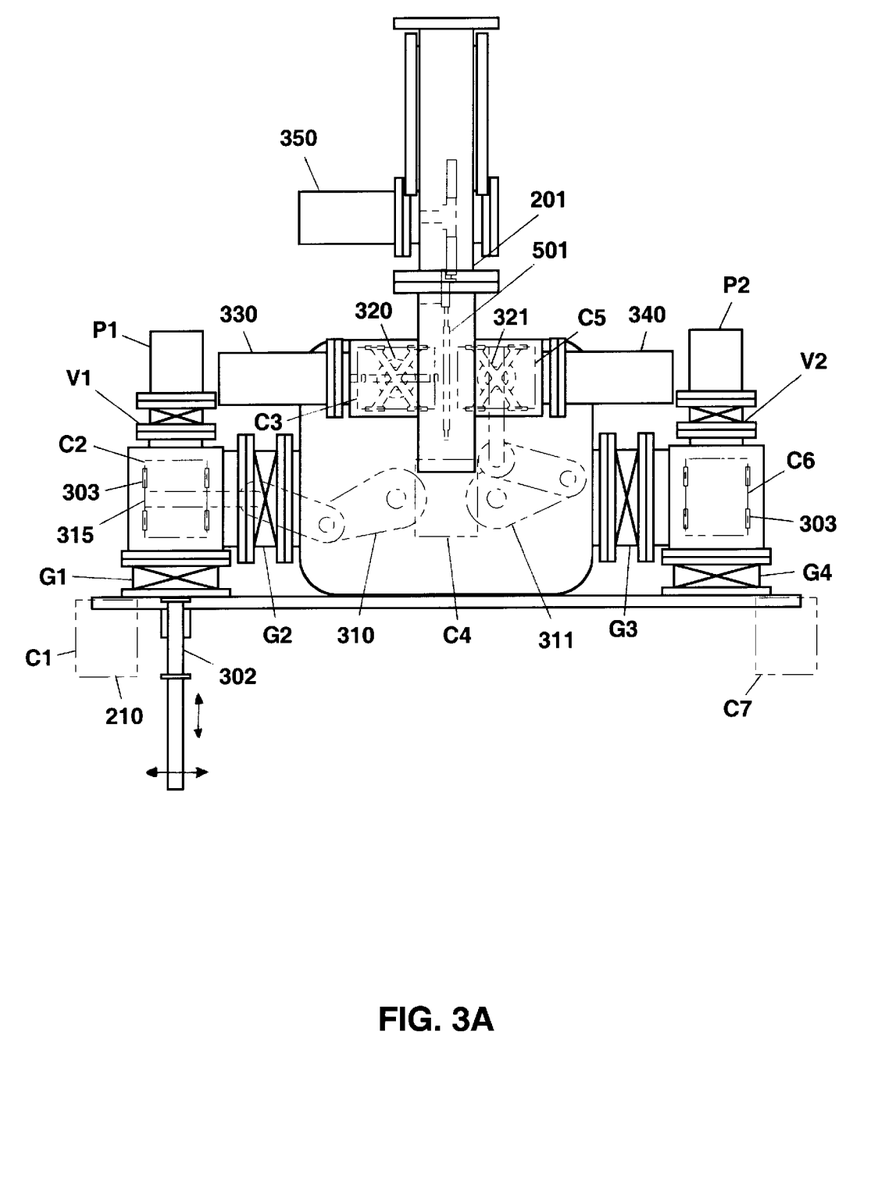
FIG. 3A is a top view of a section along FIG. 2 plane 3—3 through the embodiment of FIG. 1 showing details of the robot transfer apparatus, featuring a dual-robot transfer chamber.

A transfer chamber 102 is a structure in which cassettes are handled and substrates are transferred from the cassettes 210 into the substrate carrier assembly 501 and out of assembly 501 (FIG. 5A) to cassettes 210. The transfer chamber 102 and the main chamber 104 are typically kept at a high vacuum. The transfer chamber 102 may also have ports for a pump P3 (FIG. 1), and for attachment of conventional rough pumping equipment, sensors and instrumentation. Two embodiments of the transfer chamber and robot(s) are shown in FIG. 3A and in FIG. 3B, with substrate carrier 501 shown in the load/unload position. Yet another embodiment (not shown) includes additional intermediate cassette positions within the transfer chamber 102 to accommodate additional cassettes as would be required by the two-cassette load lock chamber.

An unload lock chamber 103 mirrors the function and structure of the load lock chamber 101 except that substrates and cassettes pass through it when leaving the system. Gate-valve G3 separates the transfer chamber 102 from the unload lock chamber 103, valve V2 selectively isolates the unload lock chamber 103 from the conventional high vacuum pump P2, and gate-valve G4 selectively isolates the unload lock chamber 103 from the environment outside.

The main chamber 104 is comprised of a plurality of chamber modules (FIG. 2) including a drive module 201, one or more station modules 202, one or more station modules 203, an idler module 204, and an end module 205. The main chamber 104 and transfer chamber 102 are mounted on a system stand 105 which also encloses some of the station utilities cabling and the control system (not shown).

Each module may have additional access ports and flanges for attaching instrumentation, pumps, sensors, or other items.

FIGS. 3A, 3B, 4, and 5 are referred to in the following discussion of the transfer chamber cassette and substrate transfer system. When the system is installed in a factory, a conveyor, robot, or factory personnel (not shown), delivers cassettes to the system and permits a prescribed number of cassettes 210 to accumulate in a queue with one cassette at position C1, until they are loaded into the system.

Figure 3B:
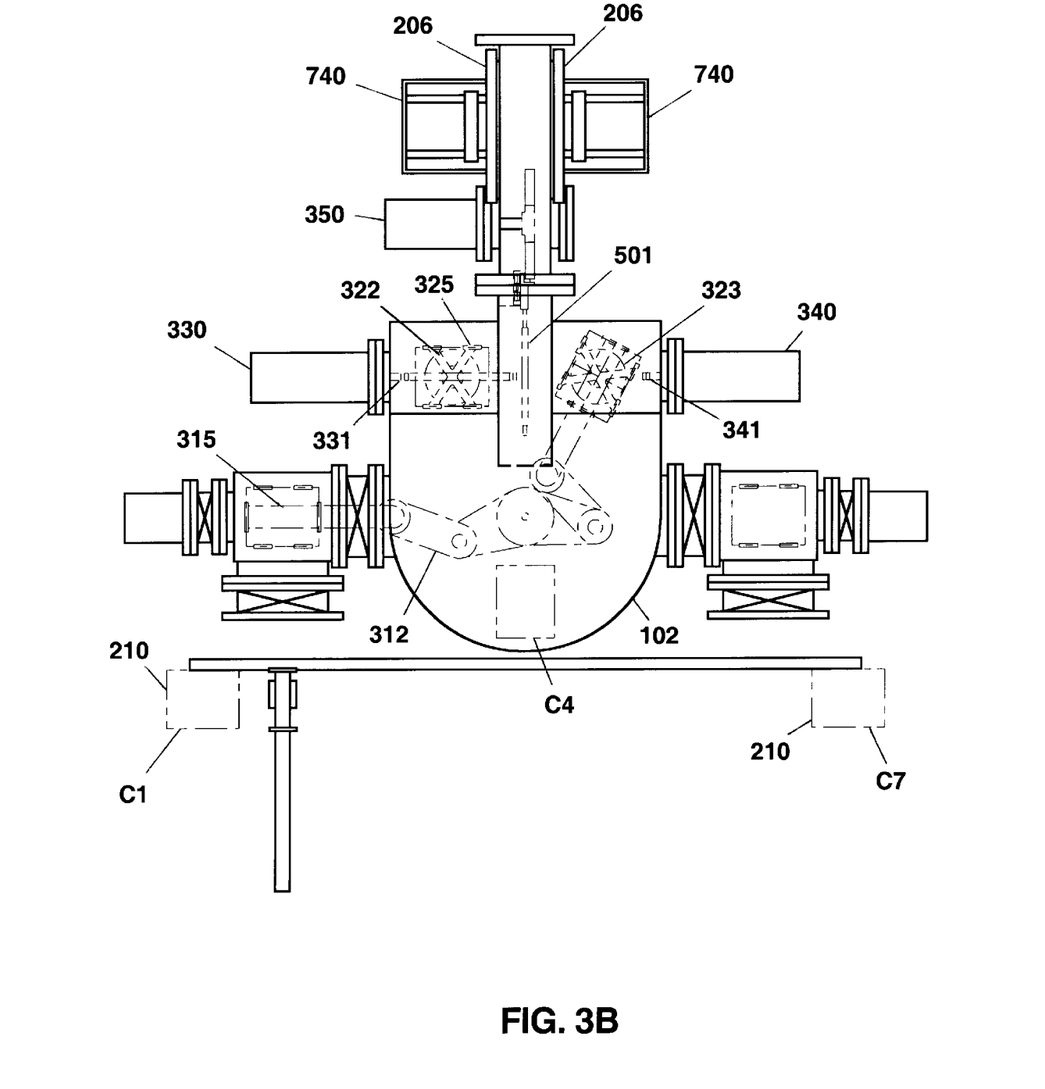
FIG. 3B is a top view of a section along plane 3—3 through another embodiment of the robot transfer apparatus, featuring a single-robot transfer chamber.
Figure 3C:
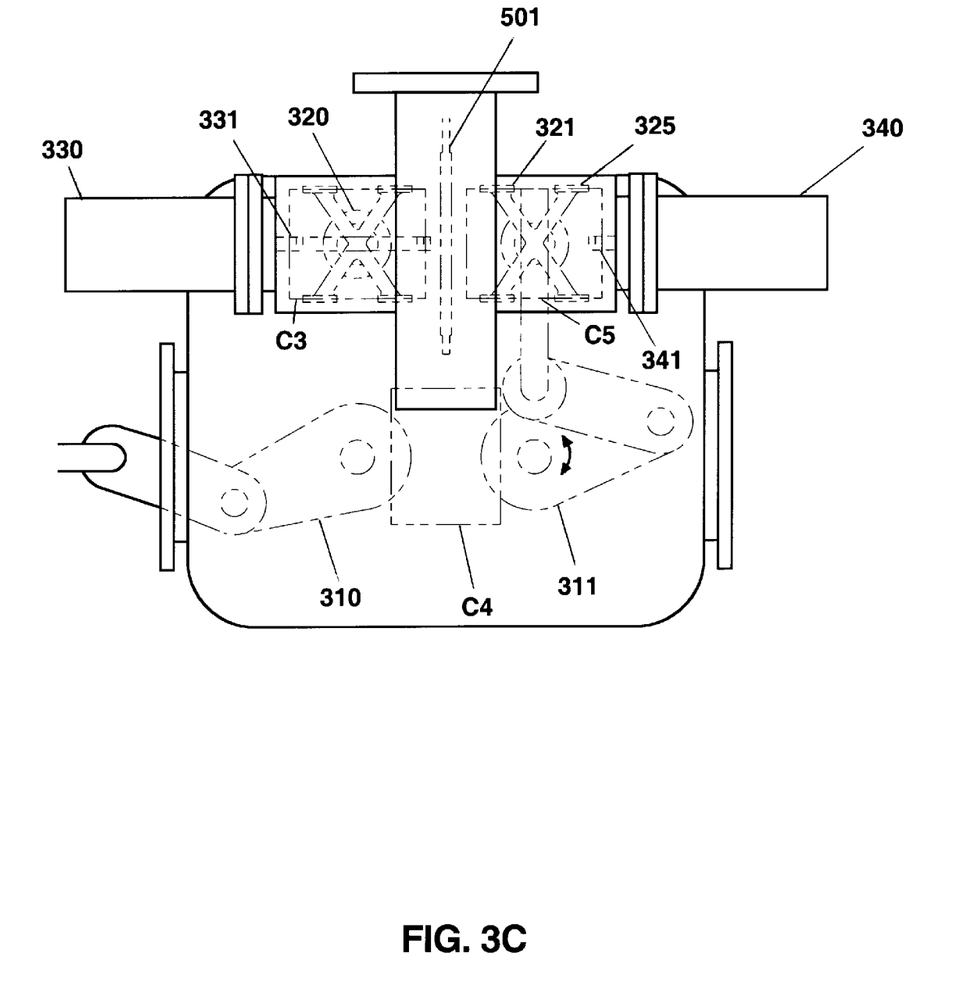
FIG. 3C is an enlarged view of FIG. 3A showing the transfer chamber.
Figure 4:
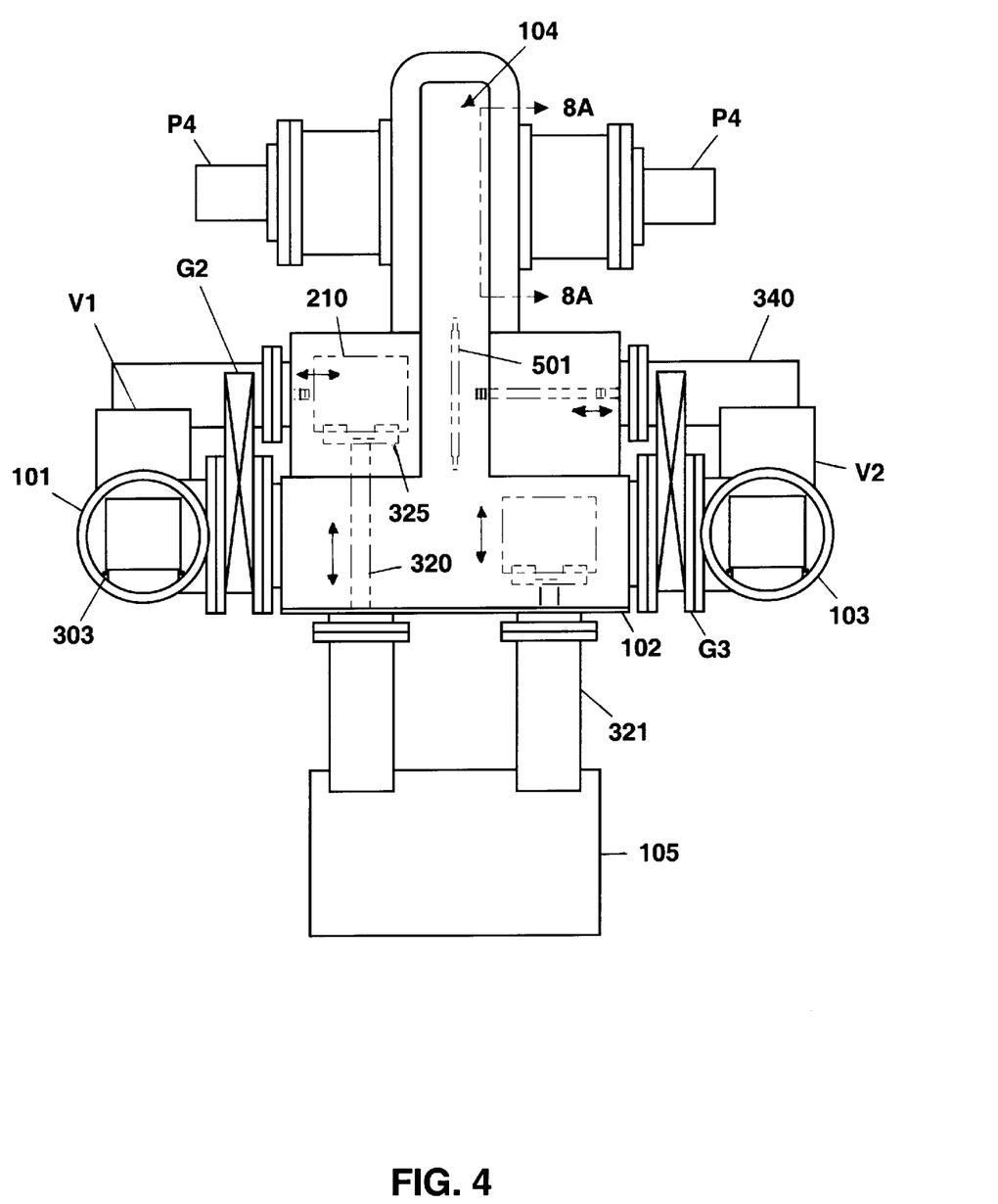
FIG. 4 is a front-end view of a section along FIG. 2 plane 4—4 through the embodiment of FIG. 1.

A conventional three-axis atmospheric robot 302 picks up the cassette at position C1 and inserts it into load lock chamber 101, then lowers the cassette onto a cassette locator 303. The atmospheric robot 302 also removes cassettes from a locator 303 in the unload lock chamber 103 and places them in position C7. The atmospheric robot's axes of motion consist of: horizontally between cassette positions C1 and C7, horizontally into lock chambers 101 and 103, and vertically for picking up and placing cassettes. The end-effector on atmospheric robot 302 is designed to accommodate each of the standard cassette sizes by engaging the base of a cassette and centering it within shallow recesses. Cassette locator 303 within load lock chamber 101 ensures that cassettes are properly positioned to be picked up by vacuum robots 310 and 311 (FIG. 3A) or 312 (FIG. 3B). Each locator 303 consists of a set of guides that position the cassette as it is lowered. The vacuum robots 310, 311, and 312 are multi-axis robots that can function in a vacuum with minimal out-gassing and without generating detrimental particulates. Vacuum robot 310 transfers a cassette from position C2 within the load lock chamber 101 to position C3 within the transfer chamber 102, and subsequently from position C3 to position C4. The vacuum robot 311 transfers a cassette from position C4 to position C5 and later from position C5 to position C6 within the unload lock chamber 103. The functions of vacuum robots 310 and 311 are combined by vacuum robot 312 in an alternate embodiment of the transfer chamber 102 (see FIG. 3B). The end-effector 315 of each vacuum robot is designed to pick up any of a variety of different sized cassettes by engaging the base of a cassette and centering it within shallow recesses. Vacuum elevators 320 and 321 (or 322 and 323) located under cassette positions C3 and C5 respectively are used to position cassettes 210 such that a cassette centerline shares the axis of motion of the substrate transit 330, 340 which moves substrates from a cassette to a substrate carrier or vice-versa. The vacuum elevators 320–323 have end-effectors 325 that engage the bottom of the cassette in a manner similar to that of end-effector 315. The FIG. 3B vacuum elevators 322, 323 have also a rotational component of motion to align the cassettes with the substrate transit 330, 340.

Figure 5A:
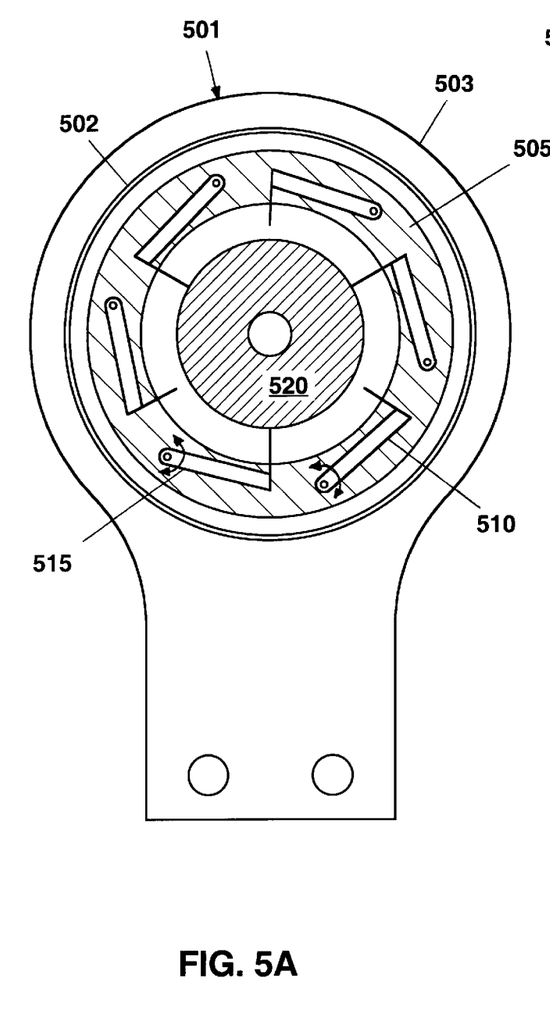
FIG. 5A is an elevation view of a preferred embodiment of the substrate carrier assembly.
Figure 5B:
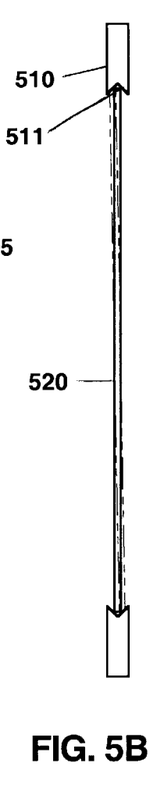
FIG. 5B is a schematic view of a preferred embodiment of the alignment pick-ups for aligning and supporting a substrate.
Figure 5C:
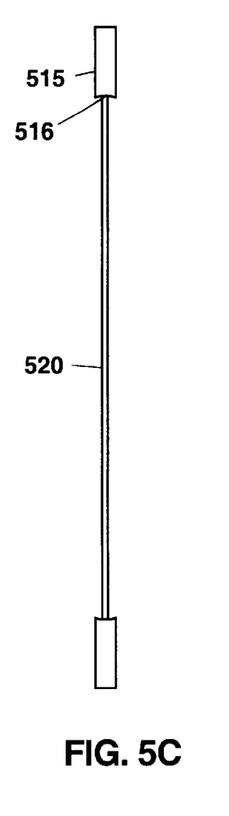
FIG. 5C is a schematic view of a preferred embodiment of the primary pick-ups supporting a substrate.

Each substrate transit 330, 340 has an end-effector 331, 341 that is positioned temporarily within, and expands to positively hold, the inner diameter of a substrate 520 (FIG. 5). When fully extended, the end-effectors reach within the substrate carrier assembly 501 shown in FIGS. 5A, 5B and 5C.

Another embodiment of the transport system can handle substrates which lack a center hole. In the alternate embodiment (not shown), the elevator end-effector 325 is replaced by a substrate comb that passes through the bottom of a cassette, engages the lower edges of the substrates and elevates the substrates until their centers are aligned with the axis of motion of the substrate transit 330, 340. The end-effector 331, 341 of each substrate transit 330, 340 is also replaced, by one that engages the outer edge of the substrate. With the exception of these two changes, the principles of operation of the preferred and these alternate embodiments are the same.

Figure 6:
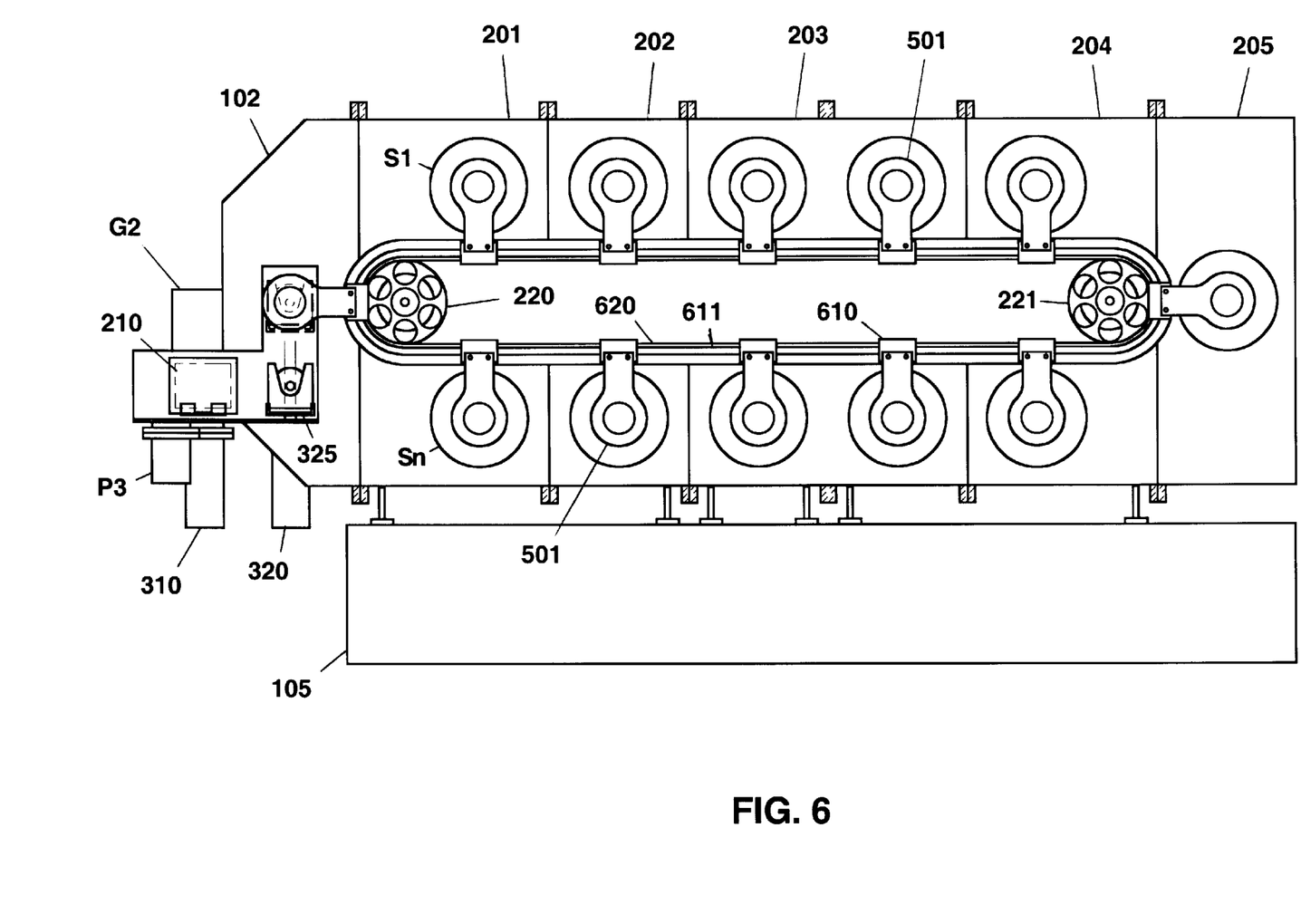
FIG. 6 is a side view of a section along plane 6—6 through the FIG. 1 embodiment.

Referring to FIGS. 2, 5A and 6, substrate carrier assembly 501 holds the substrate 520 while it is transported through each process station S1--Sn around the main chamber 104. The substrate carrier assembly 501 is comprised of a paddle 503 and a pick-up ring 505 and is attached to a carriage 610. Both faces of the paddle 503 serve as sealing surfaces for station isolators 801 (shown in FIGS. 7 to 8B).

In one embodiment, each face has an O-ring groove containing an O-ring 502 against which the station isolator seals. In another embodiment (not shown), each face has a smooth surface against which an elastomeric seal of the station isolator seals. The pick-up ring 505 is attached to the paddle 503.

The pick-up ring has two sets of pick-ups 510 and 515 with three pick-ups per set arranged about the pick-up ring 505. Each of the six pick-ups has a pivot point about which it rotates. The pick-ups 510, 515 are actuated by causing them to rotate about the pivot point such that the pick-ups engage and disengage a substrate 520. After the substrate transit 330 positions a substrate 520 within the substrate carrier assembly 501, the alignment pick-ups 510 engage the substrate 520 with a V-shaped notch 511 (FIG. 5B) that centers the substrate 520 axially within the substrate carrier 501 and aligns it within the plane defined by the notches of the three pickups. Once the substrate 520 has been "pre-aligned," primary pick-ups 515 engage the substrate 520 and the alignment pick-ups 510 rotate out of the way. Shallow recesses 516 in the primary pick-ups 515 (FIG. 5C) positively hold the substrate 520 with minimal overlap of, and interference with, the substrate face during processing. Furthermore, the pick-ups 510, 515 have a degree of compliance to compensate for thermal expansion of substrates 520.

After substrate 520 has been processed, substrate transit 340 positions the end-effector 341 within the center hole of the substrate 520. The primary pick-ups 515 retract from the substrate 520, and the end-effector engages the center hole and removes the substrate 520 by retracting until the substrate 520 is above the first available cassette slot. The elevator 321 (or 323) elevates the cassette until the substrate 520 is situated within the slot. The transit 340 then releases the substrate 520 and fully retracts. The elevator 321 (or 323) then descends to the down position until another substrate 520 is positioned above it.

FIGS. 2, 3, 4, 6 and 7 are referred to in the following discussion of the main chamber transport system. As shown in FIG. 6, carriage 610 supports substrate carrier assembly 501 and has a bearing set that allows motion of substrate carrier assembly 501 along rail 611 around the main chamber 104. Rail 611 is mounted on framework 612, which is attached to the main chamber. There is a level of compliance in the carriage that, upon activation of the station isolators 801, allows the carriage 610 and substrate carrier assembly 501 to position and accurately align in both the radial and axial directions with the current process station.

Metal belt 620 is ultra high vacuum compatible and is not a significant source of particles. It is drawn across a driving pulley 220 within drive module 201, and an idler pulley 221 in the idler module 204, to pull the carriages 610 around main chamber 104. There are N+1 carriages and substrate carriers in the system, where N is the number of process stations. The carriages 610 are attached to belt 620 in such a manner as to allow a degree of independent motion that is needed when a carriage 610 is navigating the curved sections of the rail, near driving pulley 220 and idler pulley 221. A conventional drive motor 350 is coupled by a pulley 220. Each time drive motor 350 is actuated, carriage 610 and substrate carrier assembly 501 are indexed to the next station.

Figure 7:
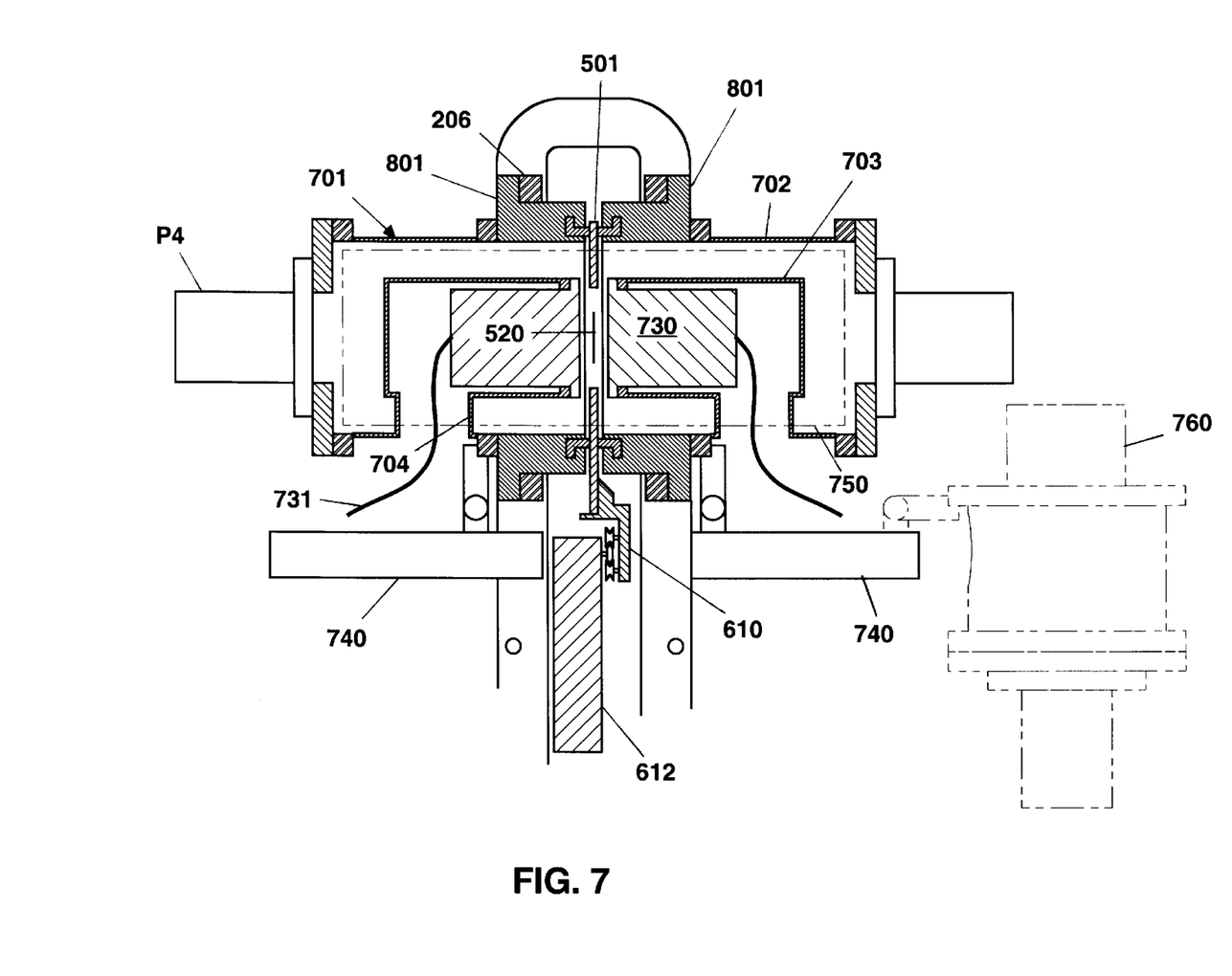
FIG. 7 is a partial side view of a section along plane 7—7 through the embodiment of FIG. 1 showing the main chamber transport means.
Figure 8A:
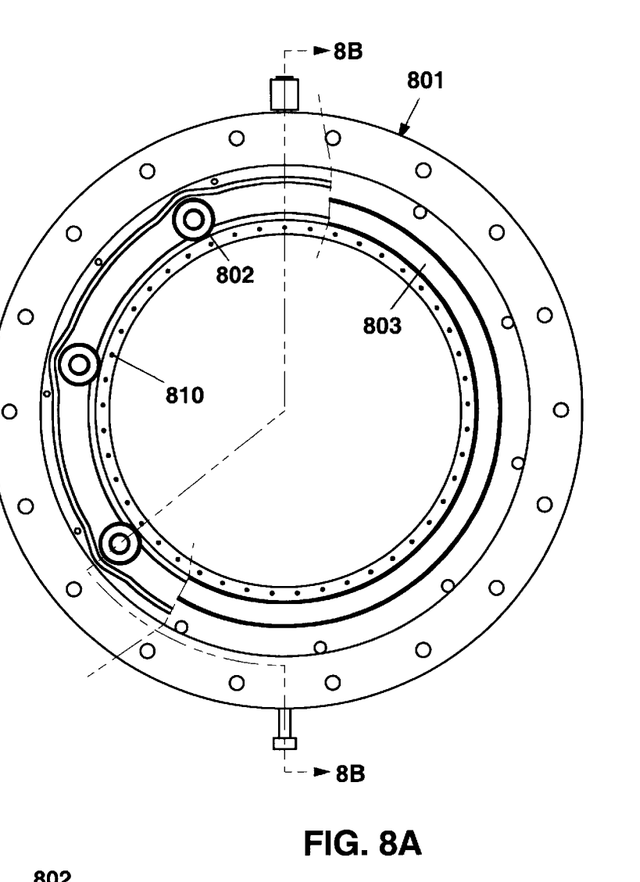
FIG. 8A is a forward sectional view of a section along FIG. 4 plane 8A—8A through a preferred embodiment of a station isolator.
Figure 8B:
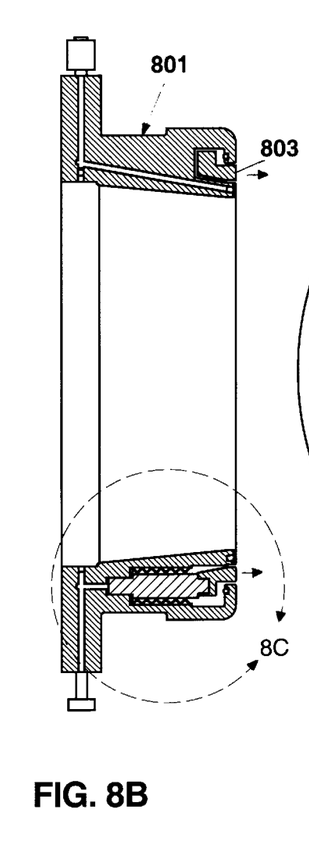
FIG. 8B is a side sectional view along FIG. 8A plane 8B—8B of a preferred embodiment of a station isolator.
Figure 8C:
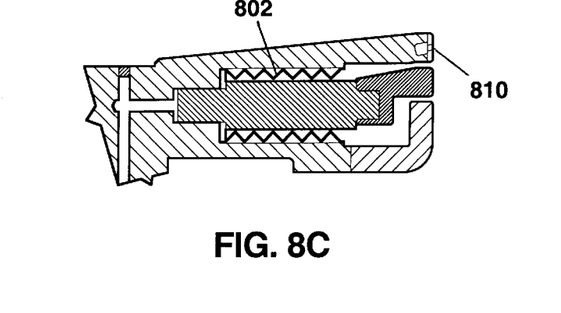
FIG. 8C is an enlargement of an expansion joint of FIG. 8B.

FIGS. 6 to 8C are referred to in the following discussion of the process stations. Each main chamber module has at least one pair of station flanges 206 (FIG. 1) in parallel planes on either side of the chamber, opposite one another. Some chamber modules have one pair of flanges and others may have two or four pairs. These flange pairs 206 define a process station. By varying the number and type of modules it is possible to vary the number of process stations in a system. The station flanges 206 can accept a number of attachments including blank-off plates, pumps, process equipment, and station isolators 801 (FIG. 7).

Some stations, in particular those which require a process gas, need to be hermetically isolated from the other stations and from the main chamber 104. In one embodiment of a station isolator, a pair of isolators are activated by selectively allowing a pressurized gas into expansion joint 802 (FIG. 8C) causing expansion joint 802 to drive sealing surface 803 against O-ring 502 on each face of the paddle 503 (FIG. 7).

Referring to FIG. 7, the typical embodiment of a sputter station includes a pair of station isolators 801 on either side of the substrate carrier assembly 501, a process barrel 701 attached to each isolator 801, and a conventional pumping apparatus P4 attached to the end of each process barrel 701. When the station isolators 801 activate, substrate carrier assembly 501, station isolators 801, process barrels 701, and pumps P4 function together as a process chamber 750 (FIG. 7) that is hermetically isolated from the main chamber 104.

Another function of the station isolator 801 is to introduce a process gas into the process chamber 750. As shown in FIG. 8A the orifices 810 that admit the process gas are arranged in a circular pattern about the station isolator 801 so that the gas can be admitted in a fairly uniform manner. Furthermore, the gas flow serves to prevent material from reaching the O-ring contact area that would adversely affect the performance of the seal. The station isolator 801 also functions as a mounting flange for a variety of attachments such as a process barrel 701 (FIG. 7).

Process barrel 701 is comprised of an outer tube 702 and an inner tube 703 supported within outer tube 702 by a tube 704 extending radially from inner tube 703 to outer tube 702. When a sputtering source 730 is installed in inner tube 703, the space enclosed by source 730 and inner tube 703 is hermetically isolated from the space between outer tube 702 and inner tube 703. When the system is under vacuum, the volume within inner tube 703 remains at atmospheric pressure. Tube 704 suspending inner tube 703 within the process barrel 701 allows utilities 731 such as water and electrical lines to reach the source 730.

A process barrel 701 or the housing of a process apparatus does not necessarily have to conform to the above description. In essence it is only necessary that the housing of a process apparatus maintain a separate environment from that outside the system, and the housing may or may not have flanges or attachment points for pumping, sensors or other instruments.

Attached to a station or process barrel 701 is an optional high vacuum pump P4, which serves to evacuate the main chamber 104 when the station isolators 801 are open and to evacuate a process chamber when a station isolator 801 is activated. Pump P4 may have a conventional valve selectively isolating it from process barrel 701 and/or a conventional throttle valve to adjust the pumping rate.

Process barrel 701 can be attached to a station slide assembly 740 that allows the station to be supported when detached from the station isolator 801, or when station isolator 801 is detached from a station flange 206. Process barrel 701 can be pulled away from main chamber 104 and rotated into a position 760 that allows for easy maintenance.

A high vacuum pump P5 is shown (FIG. 1) mounted directly to a station flange 206 and functions as a main chamber pump.

A control system (not shown) uses at least one computer and a complement of programmable logic controllers to control the system, including valves, motors, sensors, gas flow meters, pumps, regulators, power supplies, etc. A user interface (not shown) provides an interface between the operator and the control system.

OPERATION

Operation of the invention will be explained by describing the travel of single substrate 520. Typically, a substrate 520 is held with 24 other substrates in a cassette 210. For the purposes of this description, the system initially has no substrates in it, an empty cassette on the unload elevator 321, 323 at position C5 that will act as the receptacle for processed substrates, has all gates closed, a loaded cassette at C1, is at base pressure, and is ready to operate. The process of loading the empty cassette will become apparent by reading the description of how the cassette at C1 is loaded.

Referring to FIG. 3A, nitrogen is slowly released into the load lock chamber 101 to bring the pressure up to atmospheric pressure (760 Torr). Gate G1 opens, and atmospheric robot 302 raises the cassette from position C1, moves the cassette directly in front of the load lock chamber 101, extends into the load lock 101, and lowers, leaving the cassette on the cassette locator 303 at C2. The robot 302 is then free to retract and move under the next cassette, which has advanced to position C1. Gate G1 closes and seals.

Load lock chamber 101 is pumped down to rough vacuum via a conventional roughing pump (not shown). Valve V1 opens and the chamber is pumped further by pump P1 until the level of vacuum within the load lock chamber 101 is about the same as that within the transfer chamber 102. Gate G2 opens.

Vacuum robot 310 extends its end-effector 315 into load lock chamber 101, elevates the cassette off the cassette locator 303, retracts, rotates and positions the cassette at position C3 above vacuum elevator 320, 322 and lowers the cassette onto the elevator 320, 322. The robot then retracts from elevator 320, .322.

Valves V1 and G2 close and load lock chamber 101 is again brought to atmospheric pressure so that the next cassette can be loaded.

Once vacuum robot 310, 312 is clear, vacuum elevator 320 ascends until the centerline of the cassette coincides with the axis of motion of the substrate transit 330. In the alternative embodiment of FIG. 3B, elevator 322, 323 must rotate as well. Substrate transit 330 extends until the end-effector 331 is positioned within the inner diameter of the first substrate 520 it encounters (normally at the 25th slot in the cassette). Elevator 320, 322 then descends until the top of the cassette is clear of the substrate 520 being suspended on the substrate transit 330.

Once substrate 520 is clear of the cassette, the end-effector 331 expands until the substrate 520 is positively held. Ideally, substrate 520 is now in a plane parallel to substrate carrier assembly 501. Substrate transit 330 extends until it is immediately adjacent the substrate carrier assembly 501. Substrate transit 330 then extends until the plane of the substrate 520 is sharing the plane defined by the three alignment pickups 510 in substrate carrier assembly 501.

Alignment pick-ups 510 grip the outer edge of the substrate 520 thereby permitting endeffector 331 to release the substrate 520 and fully retract. Primary pick-ups 511 then grip substrate 520 and alignment pick-ups 510 retract.

Once substrate transit 330 is clear of substrate carrier assembly 501, substrate carrier assembly 501 can be indexed to the next position S1 (process station #1, FIG. 6) effecting a simultaneous one-station indexing of all substrate carriers in the main chamber 104. During sustained operation, indexing would not occur until the processes being performed in each process station S1–Sn are completed and the station isolators 801 are in a retracted position. Additionally, once the substrate transit 330 is fully retracted, cassette elevator 320 is free to rise again so that the next substrate can be transferred. Once the substrate carrier assembly 501 has been positioned, the next substrate 520 in the cassette 210 is loaded.

Once the motor driving the index motion stops, station isolators 801 are activated. Each station becomes a separate process chamber 750 (FIG. 7), hermetically separated from all the other stations and from the main chamber 104, and processing can begin. Those skilled in the art will recognize that more than one process is required, with the number and type of processes varying to produce a substrate coating with particular characteristics. The processes and sequences are not disclosed in detail herein. Typically, a substrate 520 will first be heated and then go to a series of sputter stations, but it is not unusual for other types of process equipment to be utilized. In a sputter station, a process gas such as Argon will be released into the sealed process chamber 750 so that a plasma can be created. Each isolated process chamber 750 may use different gases at different pressures without affecting the other stations. Both sides of a substrate can be processed simultaneously. Processing begins once the gas pressure within each process chamber is correct. When each process is completed the process chamber is adequately evacuated before station isolators 801 are allowed to retract to prevent gases within one process chamber 750 from cross-contaminating other stations or the system.

When actuated, station isolator 801 has the additional function of allowing a station to be opened for servicing without disturbing the vacuum environment in the main chamber 104. For servicing, operation is temporarily interrupted, station pumping is turned off, power to the station is removed, and the station is purged with nitrogen, bringing it to atmospheric pressure. The barrel is detached from the station isolator 801, allowing access to the inside of the barrel or the station. After servicing, the station is closed and the process chamber pumped to rough vacuum, then to high vacuum. Venting of the main chamber 104 and other stations is avoided and downtime is reduced.

After the substrate 520 has been to each station and returns to transfer chamber 102, substrate transit 340 extends, positioning its end-effector 341 within the inner diameter of the processed substrate 520. The primary pick-ups 515 are retracted from the substrate 520, leaving the substrate 520 engaged on the end-effector 341. Substrate transit 340 retracts to a position above the first available slot in the unload cassette on elevator 321, 323 at position C5.

The cassette at position C5 is raised until the substrate 520 on the unload substrate transit 340 is within the cassette. The end-effector 341 is then disengaged from the substrate 520 and the substrate transit 340 is retracted, leaving the substrate 520 in the cassette 210. The unload elevator 321, 323 then descends and waits until the next substrate 520 is removed from the substrate carrier 501.

When the cassette at position C3 is emptied it is moved to position C4 and the cassette in the load lock chamber 101 at position C2 is moved to position C3. Once the cassette at C5 is full it is moved into the unload lock chamber 103, position C6, and the empty cassette at C4 is moved to position C5. After the cassette is placed in the unload lock chamber 103, the valves V2 and G3 are closed and the unload lock chamber 103 is slowly vented. Once it is at atmospheric pressure, gate-valve G4 opens and the atmospheric robot 302 removes the cassette.

Thus, by the practice of the present invention a system and method is provided for processing substrates with higher quality thin films, in a more economical way, with a more easily maintained processing system.

While the present invention has been described herein with reference to particular embodiments, it will be appreciated that modifications may be made without departing from the spirit of the invention. Therefore, the scope of the invention is defined by the following claims.

What is claimed is:

1. A system for handling a plurality of substrates having an outer edge, comprising:

a load lock chamber for passing said substrates;

an unload lock chamber for passing said substrates;

a transfer chamber in which said substrates are moved to and from a substrate carrier;

a vacuum robot for moving said substrates from said load lock chamber to said transfer chamber, and for moving said substrates from said transfer chamber to said unload lock chamber;

a substrate transit having a single axis of motion for moving said substrates to and from said substrate carrier;

a vacuum elevator for positioning said substrates on said substrate transit axis of motion in said transfer chamber;

a main vacuum chamber including at least one chamber module having a process station with a first side and a second side, and said substrate carrier moving said substrates within said main vacuum chamber; and a vertically oriented race-track shaped track for guiding said substrate carrier within said main vacuum chamber.

2. The system of claim 1 further comprising, on each said process station first side and second side:

a station isolator which delivers process gases and is sealable against said substrate carrier; and a process apparatus which seals said process station from atmospheric environment;

said process station, said station isolators when sealed against said substrate carrier, and said process apparatus together forming a process chamber.

3. The system of claim 2 wherein each said station isolator comprises an expansion joint which is expandable to seal said isolator against said substrate carrier and thereby hermetically isolate said substrate in said carrier from said main vacuum chamber.

4. The system of claim 3 wherein said station isolator has orifices, arranged in a circular pattern about said station isolator, for delivering said process gases in a uniform manner.

5. The system of claim 3 wherein said station isolator can serve as a mounting flange.

6. The system of claim 2 wherein said process apparatus comprises:

a process source; and a process barrel including
an inner tube enclosing said process source,
an outer tube enclosing said inner tube, and coaxial to said inner tube, and
a utility tube connecting said process source to said outer tube;

wherein said process source is hermetically isolated from said process station.

7. The system of claim 6 wherein said process source remains at the same pressure as said atmospheric environment, and said utility tube conducts utilities to said process source.

8. The system of claim 6 wherein said process source comprises a sputtering source.

9. The system of claim 6 wherein said process apparatus further comprises a station slide which supports said process barrel when said process barrel is uncoupled from said station isolator, or said station isolator is uncoupled from said main vacuum chamber.

10. The system of claim 9 wherein said process chamber can be vented to said atmospheric environment, and then said process apparatus can be uncoupled from said station isolator.

11. The system of claim 2 wherein said substrate carrier comprises first and second sets of pick-ups that center said substrate within said substrate carrier.

12. The system of claim 11 wherein:

each said pickup includes a pivot point about which said pickup rotates;

said first set of pick-ups comprises a plurality of primary pick-ups for holding said substrate as said substrate carrier moves within said main vacuum chamber, actuated to rotate about said pivot point to engage, center and positively hold said substrate outer edge; and said second set of pick-ups comprises a plurality of alignment pick-ups arranged about said substrate carrier which extend to position said substrate so that it can be held by said primary pick-ups, and retract after said substrate is held by said primary pick-ups.

13. The system of claim 2 wherein said main vacuum chamber comprises a plurality of said chamber modules, each having at least one said process station and being capable of mating with another said chamber module and with said transfer chamber.

14. The system of claim 13 wherein each said process station has a dedicated high vacuum pump, and can carry out coating processes independently of others of said process stations.

15. The system of claim 14 wherein various ones of said process stations are dedicated to different processes.

16. The system of claim 2 wherein said process chamber can support a high vacuum pump.

17. The system of claim 1 wherein said main vacuum chamber, said load lock chamber and said unload lock chamber each is provided with a respective rough vacuum pump and a respective high vacuum pump.

18. The system of claim 1 wherein said transfer chamber is provided with a high vacuum pump.

19. The system of claim 1 further comprising transport means for inserting a cassette into said load lock chamber and for removing said cassette from said unload lock chamber, each said cassette containing one or more said substrate.

20. The system of claim 19 wherein a center hole is provided in each said substrate, and wherein said substrate transit has an end-effector positionable within said substrate center hole and is expandable to positively hold said substrate during transfer of said substrate from said cassette to said substrate carrier.

21. The system of claim 1 further comprising carriage means for supporting and moving said substrate carrier on said track.

22. The system of claim 21 further comprising means for intermittently indexing said carriage means to effect simultaneous one-station indexing of all said substrate carriers.

23. A system for processing a plurality of substrates, each said substrate having two planar faces and an outer edge, comprising:

a main vacuum chamber;

at least one process station contiguous with said main vacuum chamber;

a load lock chamber having a load entrance opening with a first sealable door, and a load exit opening with a second sealable door;

an unload lock chamber having an unload entrance opening with a third sealable door, and an unload exit opening with a fourth sealable door;

a transfer chamber having an entrance opening adjacent said second sealable door and an exit opening adjacent said third sealable door, and open to said main vacuum chamber;

transfer chamber transport means for transporting said substrates from inside said load lock chamber to inside said transfer chamber, and for transporting said substrates from inside said transfer chamber to inside said unload lock chamber;

main chamber transport means including a plurality of individual substrate carriers having two faces, each said face having first sealing means, and each said substrate carrier being attached to a flexible, endless conveying means for transferring said substrates to, from, and within said at least one said process station, and effecting simultaneous one-station indexing of all said substrates on said conveying means, whereby individual substrates are sequentially processed in each of said process stations, simultaneously with said substrates being processed in any or all of the other said process stations;

transfer chamber load and unload means for transferring said substrates from said transfer chamber transport means to said main chamber transport means and from said main chamber transport means to said transfer chamber transport means;

said at least one process station having a first side and a second side, each said first side and second side having a station isolator with a second sealing means which when activated engages and forms a seal with said first sealing means, thereby isolating said process station from said main vacuum chamber and from atmospheric environment.

24. The system of claim 23 wherein said transfer chamber transport means comprises an end-effector for securely supporting, transporting and positioning said substrates in said transfer chamber.

25. The system of claim 24 further comprising atmospheric robot means for introducing said substrates into said load lock chamber and for removing said substrates from said unload lock chamber to said atmospheric environment.

26. The system of claim 25 wherein said atmospheric robot means comprises an endeffector for securely supporting a cassette containing one or more said substrate during transport.

27. The system of claim 24 wherein said transfer chamber load and unload means includes a vertical transport means capable of vertical translation and a horizontal transport means capable of horizontal translation.

28. The system of claim 27 wherein said vertical transport means positions said substrate for engagement by said horizontal transport means.

29. The system of claim 27 wherein said vertical transport means moves in said vertical translation such that said vertical transport means allows unobstructed motion of said horizontal transport means.

30. The system of claim 27 wherein said vertical transport means includes a plurality of end-effectors for securely supporting said substrates during said vertical translation.

31. The system of claim 27 wherein a center hole is provided in said substrate, and wherein said horizontal transport means includes an end-effector that can be positioned within said substrate center hole, and activated to securely hold said substrate.

32. The system of claim 31 wherein said horizontal transport means end-effector can be positioned in a first position that does not interfere with said vertical translation of said vertical transport means.

33. The system of claim 32 wherein said horizontal transport means end-effector can be further positioned in a second position directly adjacent said main chamber transport means.

34. The system of claim 31 wherein said horizontal transport means end-effector can be further positioned in a plane corresponding to a plane established by said substrate planar faces.

35. The system of claim 23 wherein said each of said substrate carrier includes a plurality of primary pick-ups that selectively engage one or more points on said outer edge of one of said substrates allowing said substrate to be placed within said carrier, removed from said carrier, and supported by said carrier.

36. The system of claim 35 wherein each of said primary pick-ups includes a recess that engages said substrate edgewise such that said primary pick-ups positively hold said substrate with minimal overlap of, and interference with, said substrate faces.

37. The system of claim 36 wherein each said substrate carrier includes a plurality of alignment pick-ups that selectively engage said outer edge of one of said substrate after said substrate has been positioned within said carrier but prior to engagement of said substrate by said primary pick-ups, functioning to align said substrate for engagement by said primary pick-ups, and retracting from said substrate once said primary pick-ups have engaged said substrate.

38. The system of claim 37 wherein said plurality of alignment pick-ups comprises at least three alignment pick-ups, and wherein each said alignment pick-up includes a 'V' shaped notch, deeper than said recess in said primary pick-ups, that engages said substrate edgewise and centers said substrate in said carrier in a plane defined by said 'V' shaped notches of said at least three alignment pick-ups.

39. The system of claim 23, wherein said substrates are removed from, and loaded onto, said substrate carriers when said carriers are positioned in a load/unload position within said transfer chamber.

40. The system of claim 23 wherein said main vacuum chamber, said load lock chamber and said unload lock chamber further comprise rough vacuum pumping means and high vacuum pumping means.

41. The system of claim 40 wherein said transfer chamber comprises a dedicated high vacuum pump.

42. The system of claim 23 wherein several of said process stations each comprise a dedicated high vacuum pump, thereby enabling vacuum coating processes to be carried out in selected ones of said process stations.

43. The system of claim 42 wherein an individual said process station is vented to atmosphere by actuating said second sealing means, interrupting said vacuum coating process within said process station, and injecting an inert gas until said process station reaches the same pressure as said atmospheric environment.

44. The system of claim 23 wherein each of said process stations is dedicated to a specific process, with generally differing processes being carried out by the various ones of said process stations.

45. The system of claim 23 wherein said main chamber transport means includes means for intermittently indexing said main chamber transport means to effect simultaneous one-station indexing on all said substrates within said main chamber.

46. The system of claim 23 wherein said first sealing means and said second sealing means comprises an elastomer seal.

47. The system of claim 23 wherein said station isolator comprises a delivery system for delivering a process gas in a uniform manner about said substrate within said process station.

48. The system of claim 47 wherein said delivery system delivers said process gas such that particulate matter is directed away from said sealing means, thereby minimizing contamination of said sealing means.

49. The system of claim 23 wherein said process station first side and second side includes a process barrel that in conjunction with a pair of said station isolators can be isolated from said main chamber to form an isolated process chamber.

50. The system of claim 49 wherein said process barrel includes
   a process source,
   an inner tube enclosing said process source, an outer tube enclosing said inner tube, and coaxial to said inner tube, and a utility tube connecting said process source to said outer tube;

wherein said process source is hermetically isolated from said process station.

51. The system of claim 50 wherein said utility tube permits delivery of utilities to said source.

52. The system of claim 49 wherein said process barrel can be attached to a station slide which supports said barrel when said barrel is detached from said station isolator, or when said station isolator is detached from said main vacuum chamber.

53. The system of claim 23 wherein said station isolator can serve as a mounting flange.

54. The system of claim 23 wherein said conveying means comprises a vertically oriented track to guide movement of said substrate carriers.

55. The system of claim 54 further comprising carriage means for supporting and moving said substrate carriers about said main vacuum chamber.

56. A method for processing a plurality of substrates, each said substrate having two planar faces and an outer edge, comprising the steps of:

loading unprocessed substrate into a load lock chamber;

isolating said load lock chamber;

pumping said load lock chamber to a high vacuum;

bringing said load lock chamber into communication with a transfer chamber;

transporting said substrate from said load lock chamber to a transfer chamber load means inside said transfer chamber;

using said transfer chamber load means to place said substrate onto a substrate carrier assembly in a load/unload position;

suspending said substrate within said substrate carrier assembly;

sequentially indexing said substrate carrier assembly in a vertically oriented racetrack-shaped pattern to each of multiple process stations until said substrate has been processed in at least one of said process stations and returned to said load/unload position;

using a transfer chamber unload means to remove said processed substrate from said substrate carrier assembly;

transporting said processed substrate from said transfer chamber into an unload lock chamber; and removing said processed substrate from said unload lock chamber.

57. The method of claim 56 wherein said step of isolating said load lock chamber comprises closing and sealing a door.

58. The method of claim 56 wherein said step of pumping said load lock chamber comprises opening a first valve permitting said chamber to be pumped to a rough vacuum, opening a second valve permitting said chamber to be pumped to high vacuum, and closing said first valve.

59. The method of claim 56 wherein said step of bringing said load lock chamber into communication with a transfer chamber comprises opening a door between said load lock chamber and said transfer chamber.

60. The method of claim 56 wherein said step of sequentially indexing uses a motor to effect simultaneous one-station indexing of all said substrates being transported by said substrate carrier assembly.

61. The method of claim 56 wherein said step of sequentially indexing said substrate carrier assembly comprises processing said substrates in individual said process stations in isolation from processes occurring simultaneously in others of said process stations.

62. The method of claim 61 wherein said step of sequentially indexing comprises using a station isolator to force a dynamic seal against a static seal on said substrate carrier assembly that isolates said process station and thereby create a process chamber, delivering a process gas through said station isolator into said process chamber in a uniform manner about said substrate, initiating said process, completing said process, evacuating the majority of said gas from said process station, and permitting said dynamic seal to retract from said static seal so that said process station is no longer isolated.

63. The method of claim 62 wherein said step of evacuating uses a pump in communication with said process station.

64. The method of claim 56 further comprising, after each said step of sequentially indexing, repeating said step of using said transfer chamber load means to place one of said substrates onto said substrate carrier assembly.

65. The method of claim 56 wherein said step of loading unprocessed substrate uses a first transport means to load said substrates into said load lock chamber and to lower said substrates onto a plurality of alignment pick-ups, and then retract said first transport means from said load lock chamber.

66. The method of claim 65 wherein said step of transporting said substrate from said load lock chamber uses a second transport means to extend an end-effector into said load lock chamber beneath said substrate, raise said substrate off said plurality of alignment pick-ups, move said substrate into said transfer chamber and position said substrate above a vertical transport means.

67. The method of claim 66 wherein said step of using said transfer chamber load means further comprises:

providing a center hole in each said substrate;

providing a cassette to hold said substrates;

using said vertical transport means to elevate said cassette so that a horizontal transport means can extend an end-effector into said center hole of, and engage, said substrate, and using said vertical transport means to lower said cassette enough to not interfere with said horizontal transport means as it extends to said substrate carrier assembly in said load/unload position, and places said substrate in said substrate carrier assembly.

68. The method of claim 67 wherein said step of suspending said substrate comprises using at least three said alignment pick-ups arranged about said main chamber transport means to engage said substrate outer edge and to position said substrate within a plane defined by said alignment pick-ups, disengaging and retracting said main chamber transport means, engaging said substrate outer edge by a plurality of primary pick-ups arranged about said main chamber transport means, permitting said alignment pick-ups to retract, and supporting said substrate as it is moved to each said process station.

69. The method of claim 67 further comprising, after said step of using said transfer chamber load means has loaded all of said substrates from said cassette, using said second transport means to move said cassette to a standby position and then to move a new cassette of said unprocessed substrates above said vertical transport means.

70. The method of claim 69 further comprising moving said cassette from said standby position to a position above said vertical transport means to receive said processed substrates.

* * * * *